(12) United States Patent
Matsunaga et al.

(10) Patent No.: US 12,183,844 B2
(45) Date of Patent: Dec. 31, 2024

(54) RADIATION DETECTION ELEMENT, RADIATION DETECTOR AND RADIATION DETECTION DEVICE

(71) Applicant: HORIBA, LTD., Kyoto (JP)

(72) Inventors: Daisuke Matsunaga, Kyoto (JP); Antonino Picciotto, Trento (IT); Giacomo Borghi, Trento (IT)

(73) Assignee: HORIBA, LTD., Kyoto (JP)

( * ) Notice: Subject to any disclaimer, the term of this patent is extended or adjusted under 35 U.S.C. 154(b) by 251 days.

(21) Appl. No.: 17/422,937

(22) PCT Filed: Jan. 27, 2020

(86) PCT No.: PCT/JP2020/002723
§ 371 (c)(1),
(2) Date: Jul. 14, 2021

(87) PCT Pub. No.: WO2020/162246
PCT Pub. Date: Aug. 13, 2020

(65) Prior Publication Data
US 2022/0093814 A1    Mar. 24, 2022

(30) Foreign Application Priority Data
Feb. 4, 2019  (JP) ................................ 2019-018026

(51) Int. Cl.
*H01L 31/115*  (2006.01)
*H01L 31/0203*  (2014.01)

(52) U.S. Cl.
CPC ........ *H01L 31/115* (2013.01); *H01L 31/0203* (2013.01)

(58) Field of Classification Search
None
See application file for complete search history.

(56) References Cited

U.S. PATENT DOCUMENTS

| 5,677,539 A | 10/1997 | Apotovsky et al. |
| 6,455,858 B1 | 9/2002 | Patt et al. |

(Continued)

FOREIGN PATENT DOCUMENTS

| JP | H09-246587 A | 9/1997 |
| JP | H10-512372 A | 11/1998 |

(Continued)

OTHER PUBLICATIONS

N. Moffat, et al, Low Gain Avalanche Detectors (LGAD) for particle physics and synchrotron applications; Journal of Instrumentation, vol. 13, No. 3, Mar. 2018, XP055776726, 14 pages.

(Continued)

*Primary Examiner* — Sarah K Salerno
(74) *Attorney, Agent, or Firm* — LUCAS & MERCANTI, LLP

(57) ABSTRACT

The radiation detection element comprising a semiconductor part having a plate shape, a first electrode that is disposed on a first surface being one surface of the semiconductor part and that collects charges generated by incidence of radiation in the semiconductor part, a second electrode that is disposed on a second surface being the other surface of the semiconductor part and that is applied with voltage needed for collecting the charges, and a heavily-doped layer that is disposed at a region of the second surface excluding an edge of the semiconductor part and is doped heavier than the semiconductor part with dopants for making a type of a semiconductor equal to that of the semiconductor part. The heavily-doped layer is on the second surface located at a position overlapped with the second electrode and is thicker than the second electrode.

9 Claims, 12 Drawing Sheets

(56) References Cited

U.S. PATENT DOCUMENTS

| | | | |
|---|---|---|---|
| 2002/0011639 A1* | 1/2002 | Carlson | H01L 27/1464 257/443 |
| 2004/0149919 A1 | 8/2004 | Lechner et al. | |
| 2005/0173733 A1* | 8/2005 | Struder | H01L 27/14603 257/E31.086 |
| 2013/0200477 A1* | 8/2013 | Sun | H01L 31/022416 257/431 |
| 2017/0184734 A1* | 6/2017 | Picciotto | G01T 1/366 |
| 2018/0315882 A1* | 11/2018 | Schulze | H01L 31/0288 |
| 2019/0011577 A1 | 1/2019 | Zorzi et al. | |
| 2020/0233103 A1* | 7/2020 | Liang | H01L 31/1812 |

FOREIGN PATENT DOCUMENTS

| | | |
|---|---|---|
| JP | 2003504856 A | 2/2003 |
| JP | 2013145180 A | 7/2013 |
| JP | 6159133 B2 | 7/2017 |
| JP | 2019015639 A | 1/2019 |

OTHER PUBLICATIONS

G. Pellegrini, et al; Technology developments and first measurements of low gain avalanche detectors (LGAD) for high energy physics applications; Nuclear Instruments and Methods in Physics Research Section A: Accelerators, Spectrometers, Detectors and Associated Equipment, vol. 765, Nov. 2014; XP055167310, 5 pages.

M. Ferrero, et al; Radiation resistant LGAD design; arxiv.org, Cornell University Library, Feb. 2018, XP081091329, 22 pages.

G. Pellegrini, et al; Recent technological developments on LGAD and iLGAD detectors for tracking and timing applications; Nuclear Instruments and Methods in Physics Research. Section A, Elsevier BV, vol. 831, May 2016; XP029683436, 5 pages.

Extended European Search Report dated Aug. 30, 2022 for the corresponding European patent application No. 20752887.8.

T. Knezevic, et al; Silicon drift detectors with the drift field induced by pureB-coated trenches; Photonics; 2016, vol. 3; 18 pages.

International Search Report for the corresponding patent application No. PCT/JP2020/002723 dated Mar. 24, 2020, with English translation.

* cited by examiner

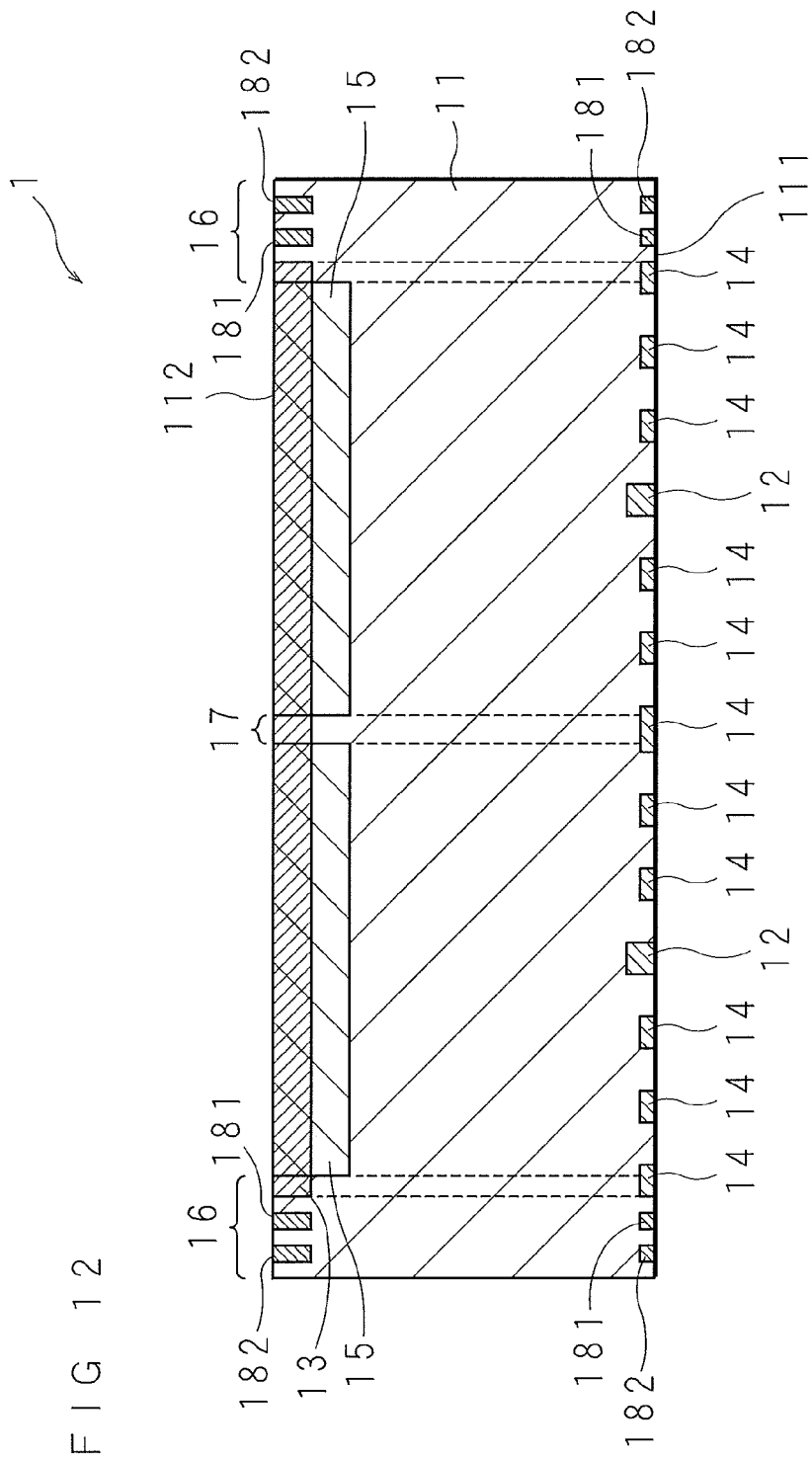

RADIATION DETECTION ELEMENT, RADIATION DETECTOR AND RADIATION DETECTION DEVICE

CROSS REFERENCE TO RELATED APPLICATION

This Application is a 371 of PCT/JP2020/002723 filed on Jan. 27, 2020 which, in turn, claimed the priority of Japanese Patent Application No. 2019-018026 filed on Feb. 4, 2019, both applications are incorporated herein by reference.

FIELD

The present invention relates to a radiation detection element, a radiation detector and a radiation detection device.

BACKGROUND

Examples of a radiation detector for detecting radiation such as X-rays or the like include a radiation detection element with a semiconductor. Examples of the radiation detection element with a semiconductor include a silicon drift detection element, for example. A radiation detector provided with the silicon drift detection element is called a silicon drift detector (SDD).

The radiation detection element with a semiconductor includes a flat-plate semiconductor part. The semiconductor part has a first electrode that outputs a signal on one surface and a second electrode that is applied with voltage on the other surface. By application of voltage, an electric field is generated inside the semiconductor part. If radiation is incident into the semiconductor part, electric charges are generated inside the semiconductor part and move in accordance with the electric field. A part of the electric charges are collected to the first electrode, from which a signal corresponding to the amount of electric charges is output. Furthermore, some of the conventional radiation detection elements include ones provided with multiple first electrodes. For example, a radiation detection element is employed for which multiple first electrodes are arranged on one surface of a flat-plate semiconductor in a two dimensional manner. Due to the design of the radiation detection element, charges generated inside the semiconductor by radiation are likely to be collected to the closest first electrode.

Inside the semiconductor part, a region where an electric potential gradient is gentle is present at the position farthest from the first electrode. If radiation is incident into this region, the generated electric charges are dispersed by diffusion, so that some of the electric charges may move to directions different from the first electrode or may move slowly to the first electrode. As a result, much time may be needed for signal processing or accurate radiation energy may sometimes not be measured since a part of the electric charges fail to be collected to the first electrode.

For the radiation detection element provided with the multiple first electrodes, the intermediate region located between the multiple first electrodes is a region where the electric potential gradient is gentle. The charges generated at this region may be dispersed to the multiple first electrodes and collected there. Here, signals are output from the multiple first electrodes relative to one radiation, which obscures the count and the energy of the radiation.

In order to solve the above-described problems, a collimator is disposed in such a manner as to cover the region where the electric potential gradient is gentle. By the collimator, the incidence of the radiation into this region can be prevented.

Alternatively, a technique of disposing an electrode around the second electrode for increasing an electric potential gradient at the position farthest from the first electrode has also been developed. The electric potential gradient increases to move the electric charges fast. Japanese Patent No. 6159133 discloses a technique of neglecting a signal caused by the radiation that has been incident into the intermediate region located between multiple first electrodes.

SUMMARY

The radiation detection element provided with a collimator increases in size. The radiation detection element provided with an electrode for increasing the electric potential gradient further needs a structure to place wiring or the like to apply a potential to the electrode, which complicates the structure and increases the size. If the size of the overall radiation detection element is fixed, a sensitive area capable of detecting radiation is reduced. Such reduction of the sensitive area also occurs even in the case where a signal caused by the radiation that has been incident into the intermediate region between the multiple first electrodes is neglected as well.

The present disclosure is made in view of such circumstances and an object thereof is to provide a radiation detection element that has an expanded sensitive area, a radiation detector and a radiation detection device.

A radiation detection element, according to an aspect of the present disclosure, comprising a semiconductor part having a plate shape, a first electrode that is disposed on a first surface being one surface of the semiconductor part and that collects charges generated by incidence of radiation in the semiconductor part, and a second electrode that is disposed on a second surface being the other surface of the semiconductor part and that is applied with voltage needed for collecting the charges, is characterized by comprising a heavily-doped layer that is disposed at a region of the second surface excluding an edge of the semiconductor part and is doped heavier than the semiconductor part with dopants for making a type of a semiconductor equal to that of the semiconductor part, wherein the heavily-doped layer is on the second surface located at a position overlapped with the second electrode and is thicker than the second electrode.

In an aspect of the present disclosure, the radiation detection element is provided with a flat-plate semiconductor part, a first electrode that is disposed on a first surface of the semiconductor part and that collects charges generated in the semiconductor part and a second electrode that is disposed on a second surface of the semiconductor part and that is applied with voltage. The radiation detection element is further provided with a heavily-doped layer doped heavier than the semiconductor part with dopants on the second surface. The heavily-doped layer is not disposed at the edge of the semiconductor part. By application of voltage, an electric field is caused inside the semiconductor part. The electric potential gradient is greater and the equipotential surfaces are denser at the heavily-doped layer than the other regions. Moreover, the heavily-doped layer is located in such a position as to be overlapped with the second electrode and is thicker than the second electrode. Thus, the heavily-doped layer has a greater electric potential gradient at a position deeper than the second electrode. At or near the edge of the semiconductor part, the equipotential surfaces are inclined relative to the second surface, which generates an electric field directed to the first electrode. The electric field directed to the first electrode allows charges generated at a position far from the first electrode to readily move to the first electrode.

In the radiation detection element according to an aspect of the present disclosure, it is characterized in that the heavily-doped layer is narrower than the second electrode.

In an aspect of the present disclosure, the area of the heavily-doped layer is narrower than that of the second electrode. Thus, by voltage applied to the second electrode, an electric field occurs at the heavily-doped layer and at a region surrounding the heavily-doped layer. The electric field occurring at the region surrounding the heavily-doped layer is an electric field directed to the first electrode.

In the radiation detection element according to an aspect of the present disclosure, it is characterized in that a plurality of sets of the first electrode and the heavily-doped layer located at a reverse side of the first electrode are provided, the plurality of heavily-doped layers are spaced from each other, and the second surface includes a region located between the plurality of heavily-doped layers where the heavily-doped layer is not present.

In an aspect of the present disclosure, the radiation detection element is provided with a plurality of sets of the first electrode and the heavily-doped layer located at a reverse side of the first electrode. The plurality of heavily-doped layers are spaced away from each other, and the second surface includes a region which is located between the plurality of heavily-doped layers and at which the heavily-doped layer is not present. At this region, the equipotential surfaces are inclined relative to the second surface, which causes an electric field directed to the closest first electrode. By the electric field directed to the first electrode, charges generated at a position far from the first electrode are reliably collected to the first electrode.

The radiation detection element according to an aspect of the present disclosure, is characterized by further comprising a plurality of third electrodes that are disposed on the first surface, that surround the first electrode and that are different from each other in distance from the first electrode, wherein voltage is applied to the third electrodes such that an electric potential gradient with a potential varying toward the first electrode is generated in the semiconductor part.

In an aspect of the present disclosure, the radiation detection element is provided with a plurality of third electrodes that surround the first electrode. Voltage is applied to the third electrodes such that an electric potential gradient with a potential varying toward the first electrode is generated in the semiconductor part. The electric potential gradient allows the charges occurring inside the semiconductor to readily move to the first electrode.

In the radiation detection element according to an aspect of the present disclosure, it is characterized in that the heavily-doped layer corresponding to the first electrode is not present at a region on the second surface, the region being located on a reverse side of a position having a distance from the first electrode longer than a distance from the first electrode to the outermost third electrode out of the plurality of third electrodes on the first surface.

In an aspect of the present disclosure, the heavily-doped layer is not present at a region located on a reverse side of a position having a distance from the first electrode longer than a distance from the first electrode to the outermost third electrode. Thus, an electric field directed to the first electrode is generated at a region less affected by the electric potential gradient by the third electrode.

In the radiation detection element according to an aspect of the present disclosure, it is characterized in that the heavily-doped layer corresponding to the first electrode is not present at a region the second surface, the region being located on a reverse side of a position having a distance from the first electrode longer than a distance from the first electrode to an outer edge of the third electrode having a maximum potential difference from the first electrode out of the plurality of third electrodes on the first surface.

In an aspect of the present disclosure, the heavily-doped layer is not present at a region located on a reverse side of a position outside the outer edge of the third electrode having a maximum potential difference from the first electrode out of the plurality of third electrodes. Thus, an electric field directed to the first electrode is generated at a region less affected by the electric potential gradient by the third electrode.

In the radiation detection element according to an aspect of the present disclosure, it is characterized in that a plurality of sets including the first electrode and the plurality of third electrodes are provided, and the heavily-doped layers are not contiguous past a region located on the reverse side of the third electrode having a maximum potential difference from the first electrode out of the plurality of third electrodes.

In an aspect of the present disclosure, the radiation detection element is provided with a plurality of sets including the first electrode and the plurality of third electrodes. The heavily-doped layers are not contiguous at a region located on the reverse side of the third electrode having a maximum potential difference from the first electrode. Thus, the heavily-doped layer is not disposed at a region less affected by the electric potential gradient by the third electrode, which causes an electric field directed to the first electrode.

A radiation detector according to an aspect of the present disclosure, is characterized by comprising: the radiation detection element according to an aspect of the present disclosure; a board on which the radiation detection element is placed; and a housing that accommodates the radiation detection element and the board.

A radiation detection device according to an aspect of the present disclosure, is characterized by comprising: an irradiation unit that irradiates a sample with radiation; a radiation detector according to an aspect of the present disclosure that detects radiation generated from the sample; and an analysis unit that performs an analysis based on a detection result of radiation by the radiation detector.

In an aspect of the present disclosure, the use of the radiation detection element with an expanded sensitive area improves the detection efficiency of radiation in the radiation detector and the radiation detection device.

In an aspect of the present disclosure, the range capable of collecting charges generated by radiation to the first electrode is expanded, so that a sensitive area capable of detecting radiation in the radiation detection element is expanded. The aspect of the present disclosure has a remarkable effect that is improvement in the detection efficiency of radiation or prevention of increase in size of the radiation detection element.

The above and further objects and features will more fully be apparent from the following detailed description with accompanying drawings.

BRIEF DESCRIPTION OF DRAWINGS

FIG. 12 is a schematic cross-sectional view of the radiation detection element according to Embodiment 2.

DETAILED DESCRIPTION

The present disclosure will be described in details below with reference to the drawings depicting embodiments thereof.

Embodiment 1

Figure 1:
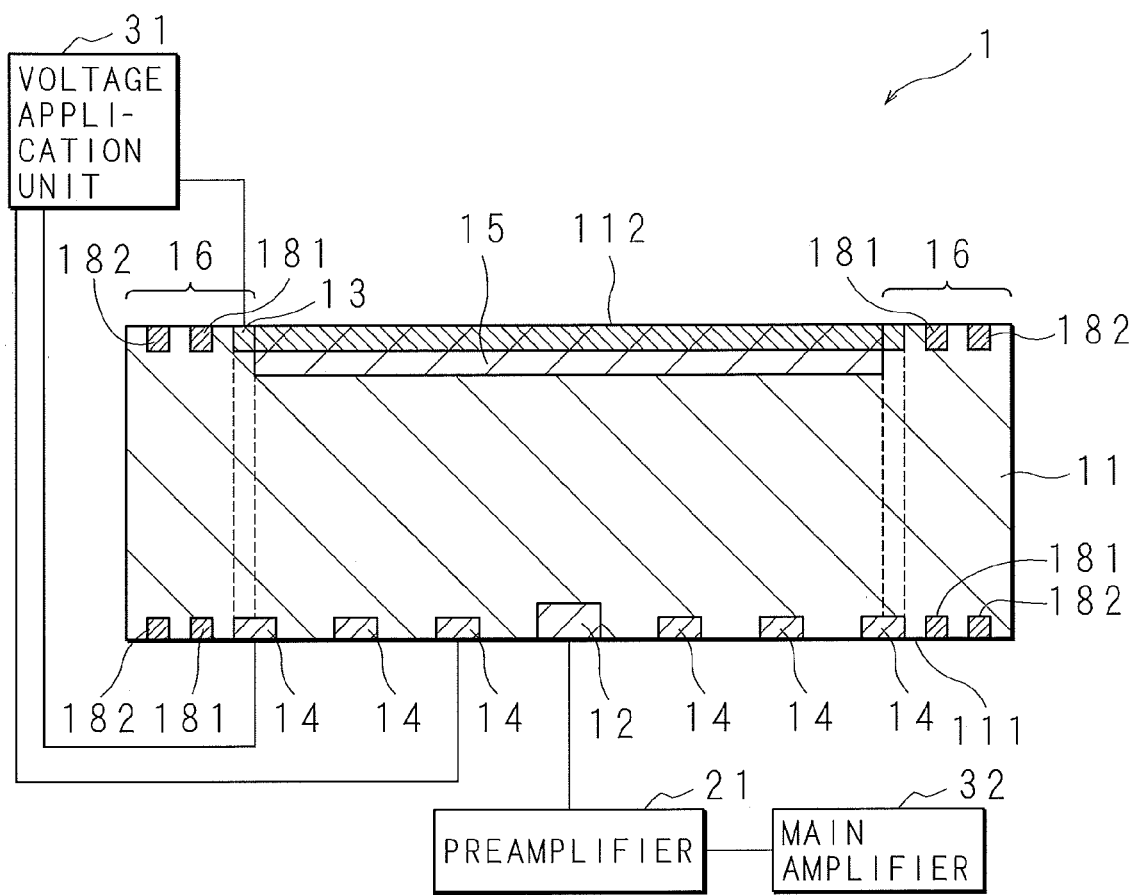
FIG. 1 is a schematic cross-sectional view of a radiation detection element according to Embodiment 1.
Figure 2:
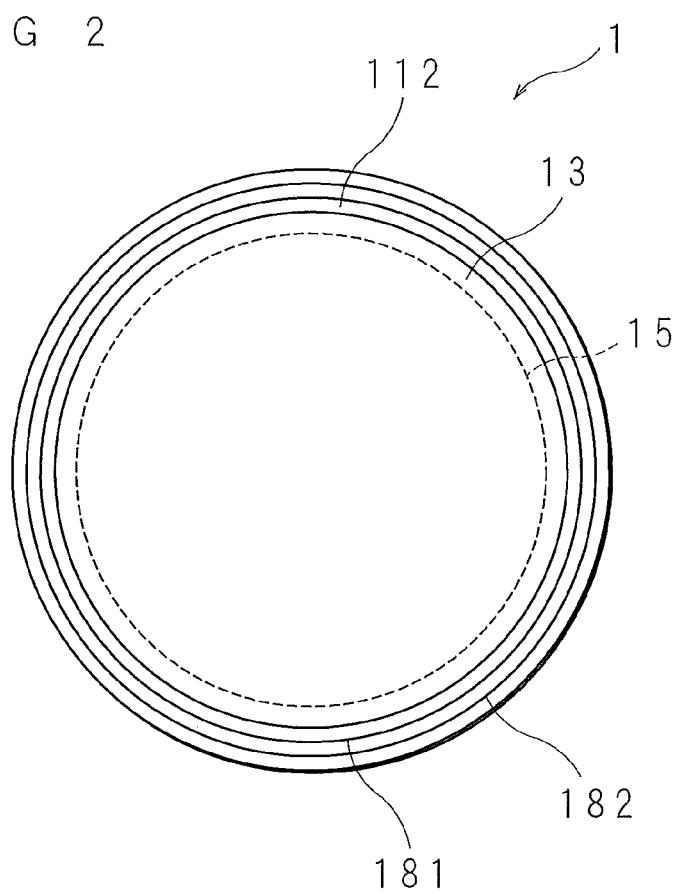
FIG. 2 is a schematic plan view of the radiation detection element according to Embodiment 1 when viewed from the second surface side.
Figure 3:
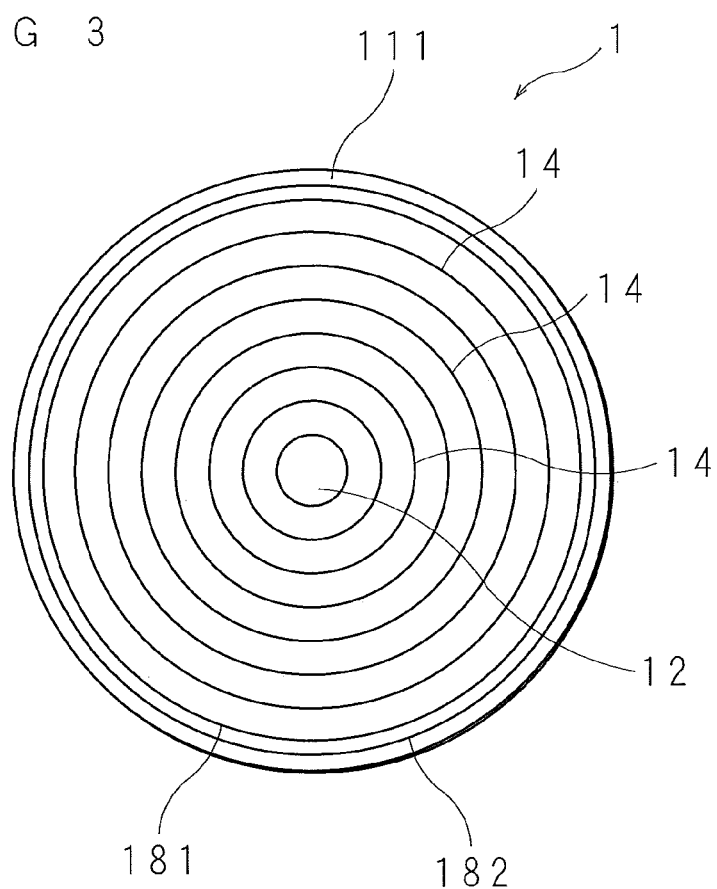
FIG. 3 is a schematic plan view of the radiation detection element according to Embodiment 1 when viewed from the first surface side.

FIG. 1 is a schematic cross-sectional view of a radiation detection element 1 according to Embodiment 1. The radiation detection element 1 is a silicon drift detection element. The radiation detection element 1 is provided with a Si layer 11 made of silicon (Si) having a discoid shape. The constituent of the Si layer 11 is an n-type Si. The Si layer 11 is a semiconductor part. The Si layer 11 has a first surface 111 and a second surface 112 located on the reverse side of the first surface 111. The second surface 112 is an incident surface on which radiation is mainly incident. FIG. 2 is a schematic plan view of the radiation detection element 1 according to Embodiment 1 when viewed from the second surface 2 side. FIG. 3 is a schematic plan view of the radiation detection element 1 according to Embodiment 1 when viewed from the first surface 111 side.

At the center of the first surface 111, a signal output electrode 12 is disposed for outputting a signal when radiation is detected. The signal output electrode 12 corresponds to a first electrode. The constituent of the signal output electrode 12 is Si being the same in type as the Si layer 11 and is doped with specific dopants such as phosphorus or the like. For example, the constituent of the signal output electrode 12 is n+Si. Furthermore, on the first surface 111, multiple curved electrodes 14 having multiple rings shape are disposed. The curved electrode 14 corresponds to a third electrode. The constituent of the curved electrodes 14 is Si being different in type from the Si layer 11. For example, the constituent of the curved electrodes 14 is p+Si obtained by being doped with specific dopants such as boron or the like. The multiple curved electrodes 14 that are arranged in multiple rings shape are approximately concentric with each other while the signal output electrode 12 is placed at approximately the center of the multiple curved electrodes 14. In other words, the signal output electrode 12 is surrounded by the multiple curved electrodes 14, and the distances from the signal output electrode 12 to the respective curved electrodes 14 are different from each other.

Though the three curved electrodes 14 are illustrated in FIGS. 1 and 3, more curved electrodes 14 are disposed in practice. Note that the shape of the curved electrode 14 may have a deformed annular shape, or the multiple curved electrodes 14 need not be concentric. Alternatively, the signal output electrode 12 may be placed at a position except for the center of the multiple curved electrodes 14 or may be placed at a position except for the center of the first surface 111. The radiation detection element 1 may have a droplet shape. The shape of the Si layer 11 may have a shape other than a discoidal shape and may have a plate shape in the form of a square, a rectangle, a trapezoid, a hexagon or the like.

A counter electrode 13 to which voltage is to be applied is formed over the almost entire surface of the second surface 112. The counter electrode 13 corresponds to a second electrode. The constituent of the counter electrode 13 is Si being different in type from the Si layer 11. For example, if the constituent of the Si layer 11 is n-type Si, the constituent of the counter electrode 13 is p+Si. Between the edge of the counter electrode 13 and the edge of the second surface 112, a ground electrode 182 to be connected to a ground potential is disposed. The ground electrode 182 has an annular shape. Between the counter electrode 13 and the ground electrode 182, a protection part 181 for preventing an electric breakdown between the counter electrode 13 and the ground electrode 182 is disposed. The protection part 181 is annular and conductive. The counter electrode 13 is connected to a voltage application unit 31. Furthermore, out of the multiple curved electrodes 14, the innermost curved electrode 14 and the outermost curved electrode 14 are connected to the voltage application unit 31. In order to uniform the electric field generated by the counter electrode 13 and to protect the surface of the counter electrode 13, a metal film such as aluminum (Al), gold (Au) or the like, or an insulator film such as an oxide film, a nitride film or the like may be disposed at the surface of the counter electrode 13 on the second surface 112.

A ground electrode 182 is disposed at the circumference of the multiple curved electrodes 14 on the first surface 111. Between the curved electrode 14 and the ground electrode 182, a protection part 181 for preventing an electric breakdown between the curved electrode 14 and the ground electrode 182 is disposed. The protection part 181 is not connected to the voltage application unit 31, and the potential of the protection part 181 is a floating potential. Note that the ground electrode 182 may be disposed on only one of the first surface 111 and the second surface 112. Even on a surface where the ground electrode 182 is not disposed, the protection part 181 may be disposed. In the case where the ground electrode 182 is not disposed, the protection part 181 prevents an electric breakdown between the edge of the Si layer 11 and the counter electrode 13 or the curved electrode 14. Alternatively, the counter electrode 13 may be formed as far as the edge of the second surface 112, and the ground electrode 182 and the protection part 181 may not be disposed.

The voltage application unit 31 applies voltage such that the potential of the innermost curved electrode 14 is the highest and the potential of the outermost curved electrode 14 is the lowest. Moreover, the radiation detection element 1 is configured such that predetermined electric resistance occurs between the adjacent curved electrodes 14 being different in distances from the signal output electrode 12. For example, by adjusting the constituent of the region located between the adjacent curved electrodes 14, an electric resistance channel where two curved electrodes 14 are connected is formed. In other words, the multiple curved electrodes 14 are connected with each other in a row via the electric resistance. Application of voltage to such multiple curved electrodes 14 by the voltage application unit 31 causes each of the curved electrodes 14 to have a potential monotonously increasing in order from the outer curved electrode 14 to the inner curved electrode 14. In other words, the potential of the curved electrodes 14 successively increases from the curved electrode 14 far from the signal output electrode 12 toward the curved electrode 14 close to the signal output electrode 12. Note that a pair of adjacent curved electrodes 14 being at the same potential may be included in the multiple curved electrodes 14.

According to the potential of the multiple curved electrodes 14, an electric field (electric potential gradient) is produced inside the Si layer 11 in such a manner that the potential increases stepwise toward the signal output electrode 12 and decreases stepwise from the signal output electrode 12. Furthermore, the voltage application unit 31 applies voltage to the counter electrode 13 such that the potential of the counter electrode 13 is an intermediate potential between the innermost curved electrode 14 and the outermost curved electrode 14. Hence, an electric field increasing toward the signal output electrode 12 is generated inside the Si layer 11. Voltage may directly be applied to the counter electrode 13, or the counter electrode 13 may be a floating electrode. In the case where the counter electrode 13 is a floating electrode, voltage is applied to the counter electrode 13 by the voltage applied to the curved electrodes 14.

The signal output electrode 12 is connected to a preamplifier 21. The preamplifier 21 is connected to a main amplifier 32. Radiation such as X-rays, general photons (including ultraviolet (UV) rays and a visible light), an electron beam or other charged particle beams is incident into the inside of the Si layer 11 to generate the amount of charges corresponding to the energy of the radiation absorbed in the Si layer 11. The generated electric charges are electrons and holes. The generated electric charges move in accordance with the electric field inside the Si layer 11, and one type of the charges concentratedly flow to the signal output electrode 12. In the present embodiment, if the signal output electrode 12 is of an n type, the electrons generated by incidence of radiation move and flow to the signal output electrode 12. The charges flowing to the signal output electrode 12 are output as a current signal, and the current signal is input to the preamplifier 21. The preamplifier 21 converts the current signal into a voltage signal and outputs the voltage signal to the main amplifier 32. The main amplifier 32 amplifies the voltage signal output from the preamplifier 21 to thereby output a signal with intensity corresponding to the energy of the radiation that is incident into the radiation detection element 1.

Figure 4:
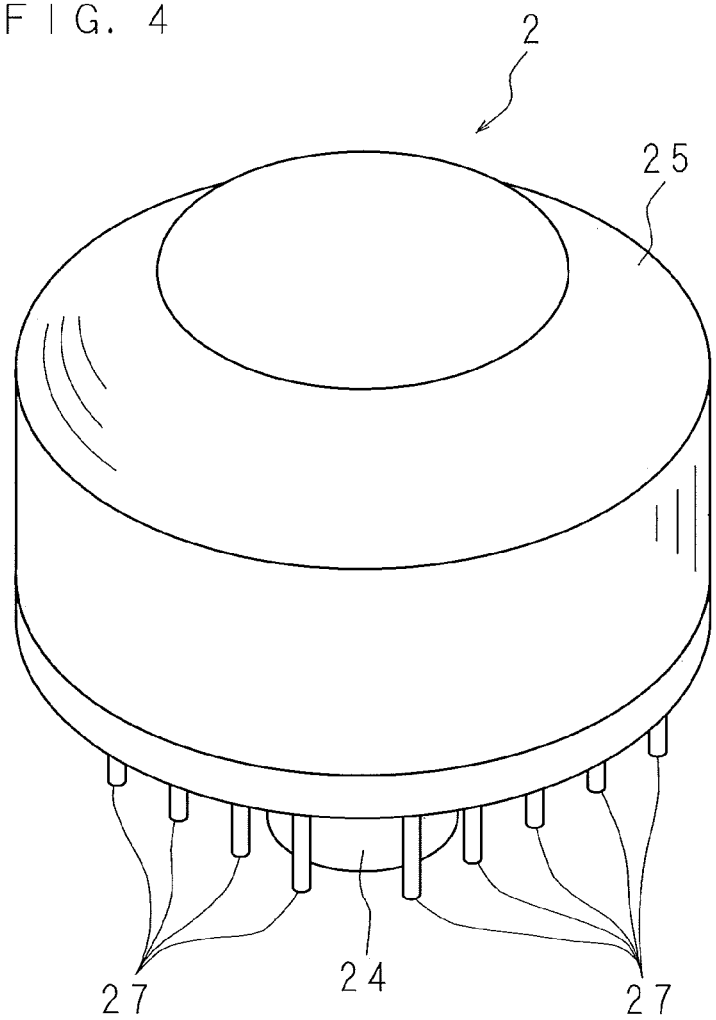
FIG. 4 is a schematic perspective view showing one example of a radiation detector provided with the radiation detection element.
Figure 5:
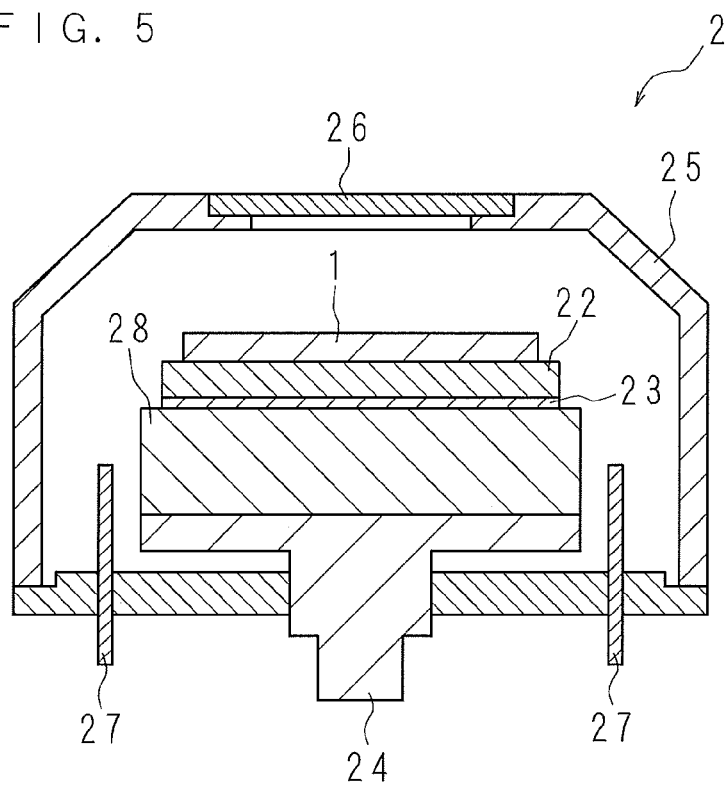
FIG. 5 is a schematic cross-sectional view showing one example of the radiation detector.

FIG. 4 is a schematic perspective view showing one example of a radiation detector 2 provided with the radiation detection element 1. FIG. 5 is a schematic cross-sectional view showing one example of the radiation detector 2. The radiation detector 2 is provided with a housing 25 being cylindrical with a truncated cone at one end thereof. At the tip of the housing 25, a window 26 through which radiation passes is disposed. The housing 25 incorporates therein the radiation detection element 1, a circuit board 22, a shielding plate 23, a cooling unit 28 and a base plate 24. The base plate 24 is also called a stem. The cooling unit 28 is a Peltier element, for example. The radiation detection element 1 is mounted on the surface of the circuit board 22 and arranged at a position facing the window 26. The radiation detection element 1 is arranged with the second surface 112 facing the window 26. The circuit board 22 is wired and mounted with the preamplifier 21. The shielding plate 23 is disposed between the cooling unit 28 and the circuit board 22 and thermally contacts a heat absorbing portion of the cooling unit 28. A heat dissipating portion of the cooling unit 28 thermally contacts the base plate 24.

The base plate 24 has a flat-plate portion on which the cooling unit 28 is placed and fixed as well as a penetrating portion that penetrates the bottom portion of the housing 25. The circuit board 22 on which the radiation detection element 1 is mounted is fastened to the cooling unit 28 via the shielding plate 23, and the cooling unit 28 is fastened to the base plate 24, whereby the base plate 24 holds the radiation detection element 1 and the circuit board 22. The shielding plate 23 is formed of a material for blocking X-rays. The shielding plate 23, if radiation is incident to the cooling unit 28 or the base plate 24, blocks the X-rays generated from the cooling unit 28 or the base plate 24 so that the X-rays are not incident to the radiation detection element 1. The heat of the radiation detection element 1 is absorbed in the cooling unit 28 through the circuit board 22 and the shielding plate 23, is transmitted from the cooling unit 28 to the base plate 24 and is dissipated to the outside of the radiation detector 2 through the base plate 24. Furthermore, the radiation detector 2 is provided with multiple lead pins 27 that penetrate the bottom portion of the housing 25. The lead pins 27 are connected to the circuit board 22 by a wire bonding or the like. Application of voltage to the radiation detection element 1 by the voltage application unit 31 and output of a signal from the preamplifier 21 to the main amplifier 32 are performed through the lead pins 27. It is noted that the radiation detector 2 may not be provided with the cooling unit 28.

Figure 6:
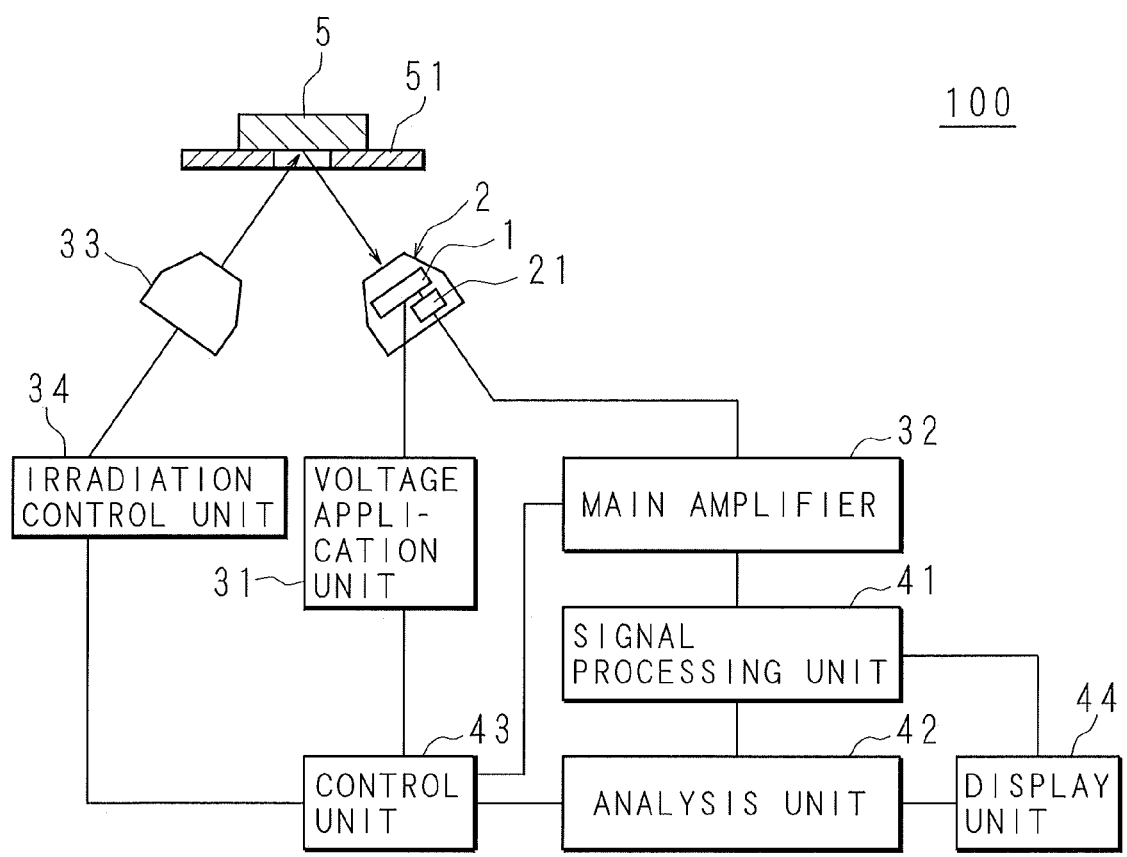
FIG. 6 is a block diagram illustrating one example of the functional configuration of a radiation detection device.

FIG. 6 is a block diagram illustrating one example of the functional configuration of a radiation detection device 100. The radiation detector 2 includes the radiation detection element 1 and the preamplifier 21. The voltage application unit 31 and the main amplifier 32 are disposed outside the radiation detector 2. A part of the preamplifier 21 may be contained in the radiation detector 2 and the other part thereof may be located outside the radiation detector 2. The radiation detection device 100 includes a sample holding unit 51 for holding a sample 5, an irradiation unit 33 for irradiating the sample 5 with radiation such as X-rays, an electron beam, a particle beam or the like and an irradiation control unit 34 for controlling the operation of the irradiation unit 33. Radiation is irradiated from the irradiation unit 33 to the sample 5, and the sample 5 then generates radiation such as fluorescent X-rays or the like. The radiation detector 2 is located in such a position as to allow the radiation generated from the sample 5 to be incident to the radiation detection element 1. In the drawing, the radiation is represented by the arrow. As described above, the main amplifier 32 outputs a signal corresponding to the energy of the radiation detected by the radiation detection element 1. The main amplifier 32 is connected to a signal processing unit 41 for performing processing on the output signal. The signal processing unit 41 counts the signals of respective values output from the main amplifier 32 and performs processing of generating the relationship between the energy and the count of the radiation, that is, a spectrum.

The signal processing unit 41 is connected to an analysis unit 42. The analysis unit 42 includes a processor for performing calculation and a memory for storing data. The signal processing unit 41 outputs data indicating the generated spectrum to the analysis unit 42. The analysis unit 42 receives the data input from the signal processing unit 41 and performs processing of identifying the elements contained in the sample 5 based on the spectrum indicated by the input data. The analysis unit 42 may perform processing of calculating the amounts of the various elements contained in the sample 5. The analysis unit 42 is connected to a display unit 44 such as a liquid crystal display or the like. The display unit 44 displays the result of the processing performed by the analysis unit 42. Moreover, the display unit 44 is connected to the signal processing unit 41 and displays the spectrum generated by the signal processing unit 41. It is noted that the analysis unit 42 may generate the spectrum of radiation instead of the signal processing unit 41 generating the spectrum of radiation.

Additionally, the radiation detection device 100 includes a control unit 43 for controlling the overall operation of the radiation detection device 100. The control unit 43 is connected to the voltage application unit 31, the main amplifier 32, the irradiation control unit 34 and the analysis unit 42, and controls the operation of the respective units. The control unit 43 is formed of a personal computer, for example. The control unit 43 may be configured to receive an operation by the user and control each of the units in the radiation detection device 100 according to the received operation. Alternatively, the control unit 43 and the analysis unit 42 may be configured by the same computer.

As illustrated in FIG. 1, the second surface 112 is provided with a heavily-doped layer 15 that is doped more heavily than the Si layer 11 with dopants making the type of the Si equal to that of the Si layer 11. For example, the Si layer 11 is doped with $10^{11}$ dopants per $cm^3$ of silicon while the heavily-doped layer 15 is doped with $10^{13}$ to $10^{17}$ dopants per $cm^3$ of silicon. Furthermore, the signal output electrode 12 is doped with $10^{19}$ dopants per $cm^3$ of silicon, for example. As illustrated in FIG. 1, the heavily-doped layer 15 is formed down to a position deeper than that of the counter electrode 13 and is thicker than the counter electrode 13.

There is a region near the surface where the heavily-doped layer 15 and the counter electrode 13 are overlapped with each other. This region is heavily doped with dopants as well as is doped with different dopants for making the type of silicon different from that of the Si layer 11. The concentration of the different dopants doping the counter electrode 13 is higher than that of the dopants doping the heavily-doped layer 15. For example, the counter electrode 13 is doped with $10^{19}$ different dopants per $cm^3$ of Si. Thus, the region where the heavily-doped layer 15 and the counter electrode 13 are overlapped with each other corresponds to Si being different in type from the Si layer 11 and functions as the counter electrode 13. The region of the heavily-doped layer 15 located at a position deeper than the counter electrode 13 is formed of Si being the same in type as the Si layer 11. If the Si layer 11 is of an n type, the region of the heavily-doped layer 15 located at a position deeper than the counter electrode 13 is formed of n-typed Si.

The heavily-doped layer 15 is disposed at the region excluding the edge of the Si layer 11. FIG. 2 indicates the range of the heavily-doped layer 15 with dotted lines. Within the dotted lines, the heavily-doped layer 15 is present. As illustrated in FIG. 2, the area of the heavily-doped layer 15 is smaller than that of the counter electrode 13 in plan view. In other words, the heavily-doped layer 15 is not present at and near the edge of the Si layer 11. A region including the edge and the near edge of the Si layer 11 will be called a marginal region 16 below. The marginal region 16 is a portion farthest from the signal output electrode 12. In the marginal region 16, the ground electrode 182 and the protection part 181 are included. In the marginal region 16, the heavily-doped layer 15 is not included. The heavily-doped layer 15 is thus present at a position reverse to the signal output electrode 12 and is not present at a position farthest from the signal output electrode 12 on the second surface 112.

It is desirable that the distance between the edge of the counter electrode 13 and the edge of the heavily-doped layer 15 is 1 μm or more. The position of the edge of the heavily-doped layer 15 is affected by the diffusion of the dopants. The distance that the dopants diffuses is approximately 0.5 μm. Thus, setting 1 μm or more of the distance between the edge of the counter electrode 13 and the edge of the heavily-doped layer 15 can reliably make the range of the heavily-doped layer 15 smaller than that of the counter electrode 13 with being less affected by the diffusion of the dopants. Note that a region with which the counter electrode 13 is overlapped and with which the heavily-doped layer 15 is not present may be disposed other than the marginal region 16.

In FIG. 1, the position of the outer edge of the heavily-doped layer 15 and the position of the outer edge of the outermost curved electrode 14 are represented by the dotted lines in plan view. As illustrated in FIG. 1, on the second surface 112, the heavily-doped layer 15 is not present at a reverse side of the position having the distance from the signal output electrode 12 longer than the distance from the signal output electrode 12 to the outermost curved electrode 14. Though an example is shown in which the position of the outer edge of the outermost curved electrode 14 and the position of the edge of the counter electrode 13 are aligned with each other in plan view in FIG. 1, they need not be aligned with each other. For example, the distance from the signal output electrode 12 to the outermost curved electrode 14 may be shorter than the distance from the signal output electrode 12 to a position at a reverse side of the outer edge of the heavily-doped layer 15. Alternatively, the distance from the signal output electrode 12 to the outermost curved electrode 14 may be longer than the distance from the signal output electrode 12 to a position at a reverse side of the outer edge of the counter electrode 13.

The outermost curved electrode 14 has a maximum potential difference from the signal output electrode 12 among the multiple curved electrodes 14. In other words, the outermost curved electrode 14 has the lowest potential among the multiple curved electrodes 14. As illustrated in FIG. 1, on the second surface 112, the heavily-doped layer 15 is not present at a reverse side of a position having a distance from the signal output electrode 12 longer than the distance from the signal output electrode 12 to the outer edge of the curved electrode 14 having the lowest potential.

Figure 7:
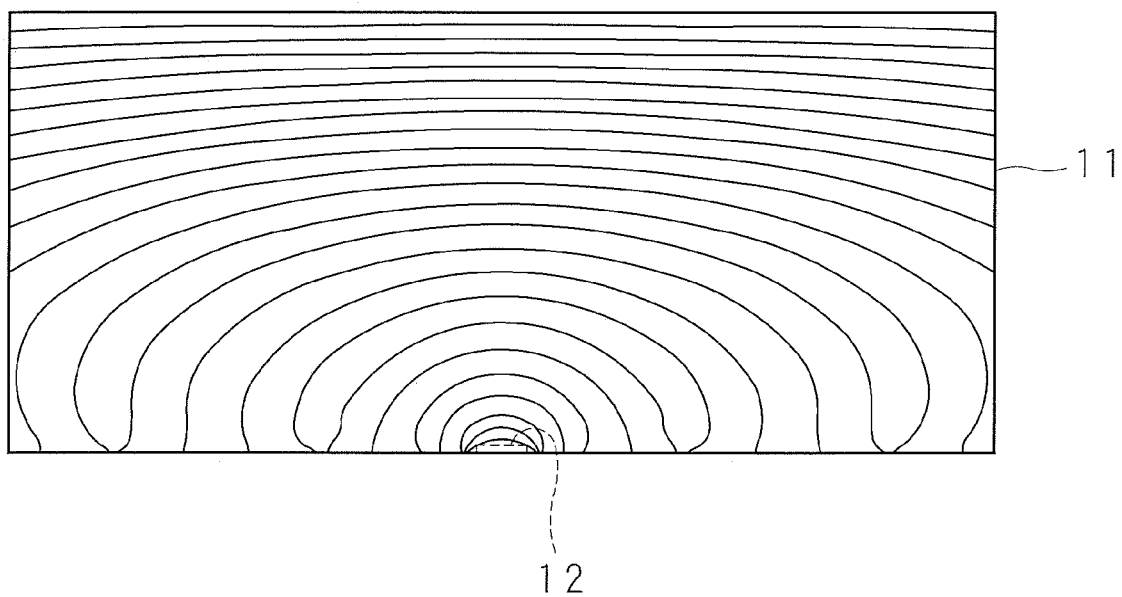
FIG. 7 is a schematic cross-sectional view showing one example of an electric field generated inside a Si layer of a conventional radiation detection element that is not provided with a heavily doped layer.
Figure 8:
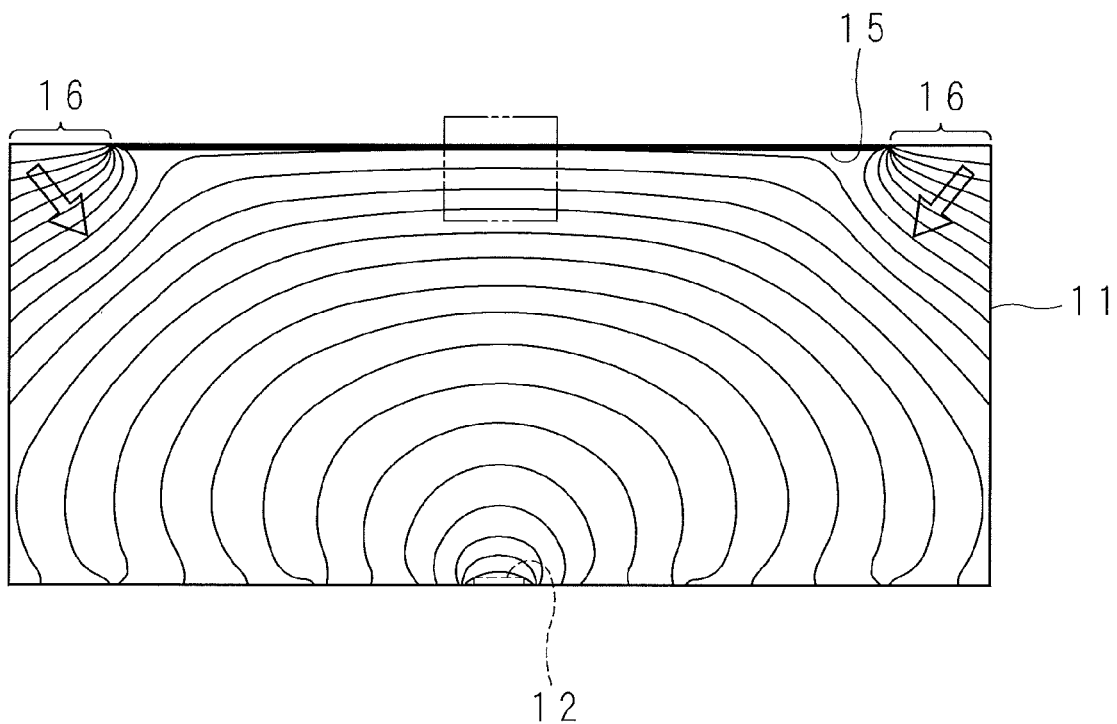
FIG. 8 is a schematic cross-sectional view showing one example of an electric field generated inside a Si layer of the radiation detection element according to Embodiment 1.

As described above, the voltage application unit 31 applies voltage to the counter electrode 13 and the curved electrodes 14 to thereby generate an electric field inside the Si layer 11. FIG. 7 is a schematic cross-sectional view showing an example of an electric field generated inside the Si layer 11 of a conventional radiation detection element that is not provided with a heavily doped layer 15. FIG. 8 is a schematic cross-sectional view showing an example of an electric field generated inside the Si layer 11 in the radiation detection element 1 according to Embodiment 1. FIGS. 7 and 8 each represent equipotential surfaces by a solid curved line and the signal output electrode 12 by dotted lines. Inside the Si layer 11, an electric field is generated such that the potential increases toward the signal output electrode 12. The position of the heavily-doped layer 15 is overlapped with the position of the counter electrode 13, which reliably generates an electric field inside the heavily-doped layer 15 as well. Furthermore, the area of the heavily-doped layer 15 is smaller than that of the counter electrode 13, which reliably generates an electric field in the marginal region 16 located outside the heavily-doped layer 15.

Figure 9:
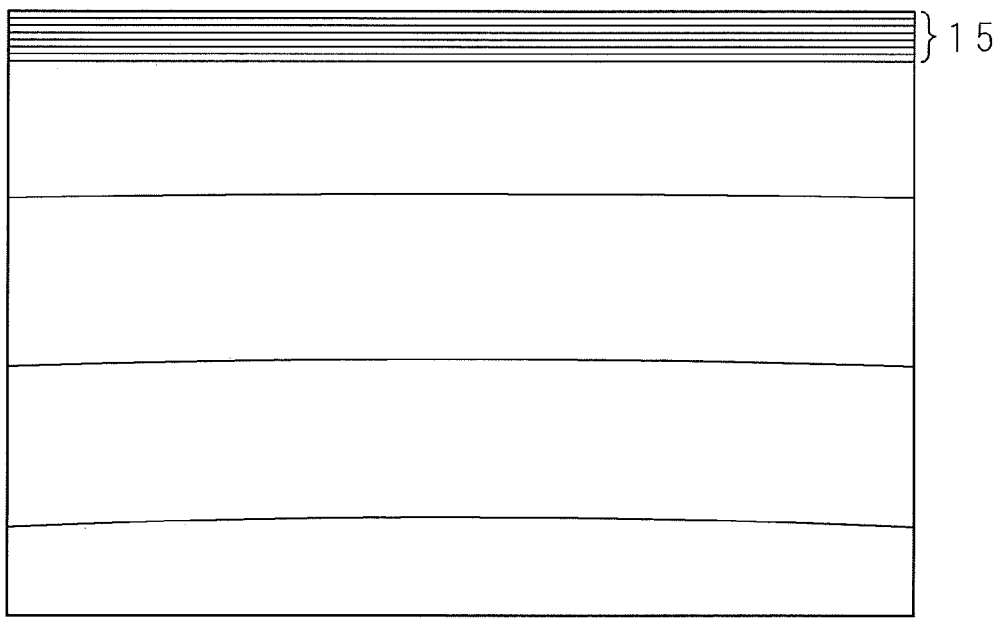
FIG. 9 is a schematic cross-sectional view showing in an enlarged manner the part enclosed by a two-dot chain line in FIG. 8.

FIG. 9 is a schematic cross-sectional view showing the part enclosed by a two-dot chain line in FIG. 8 in an enlarged manner. The region having a higher dopant concentration has a greater electric potential gradient. In other words, the electric potential gradient is greater and the equipotential surfaces are denser at the heavily-doped layer 15 than the other regions of the Si layer 11. As illustrated in FIGS. 8 and 9, especially at the region near the surface of the heavily-doped layer 15, the equipotential surfaces are dense. The heavily-doped layer 15, which is thicker than the counter electrode 13, has a greater electric potential gradient and denser equipotential surfaces at a position deeper than the counter electrode 13. At the marginal region 16 where the heavily-doped layer 15 is not present, the distance between the equipotential surfaces is narrower toward the heavily-doped layer 15 and is wider from the heavily-doped layer 15. This causes the inclined equipotential surfaces relative to the second surface 112, which generates an electric field directed to the second surface 12 as indicated by the arrows in FIG. 8. Absence of the heavily-doped layer 15 at a region located on the reverse side of the position having a distance from the signal output electrode 12 longer than the distance from the signal output electrode 12 to the outermost curved electrode 14 allows generation of an electric field directed to the signal output electrode 12 at a region less affected by the electric potential gradient due to the curved electrodes 14. The electric field occurring at the marginal region 16 is directed more toward the signal output electrode 12.

The electric field generated in the marginal region 16 occurs in the direction more toward the signal output electrode 12 in the present embodiment compared to the electric field generated in the marginal region of the conventional radiation detection element illustrated in FIG. 7. If charges due to the radiation occurs, the charges flow to the direction of an electric field. Thus, in the present embodiment, charges generated in the marginal region 16 is more likely to flow toward the signal output electrode 12 as compared with the conventional radiation detection element. In other words, the radiation detection element 1 according to the present embodiment is able to more reliably collect the charges generated at a position far from the signal output electrode 12 toward the signal output electrode 12 than the conventional radiation detection element. This expands the range capable of collecting charges generated by radiation to the signal output electrode 12. Accordingly, the sensitive area capable of detecting radiation in the radiation detection element 1 is expanded.

In the present embodiment, charges generated at positions far from the signal output electrode 12 are reliably collected, whereby the sensitive area can be expanded without uselessly increasing the size of the radiation detection element 1. The expansion of the sensitive area improves the detection efficiency of radiation. Moreover, the simple structure for expanding the sensitive area simplifies the structure of the radiation detection element 1.

Embodiment 2

Figure 10:
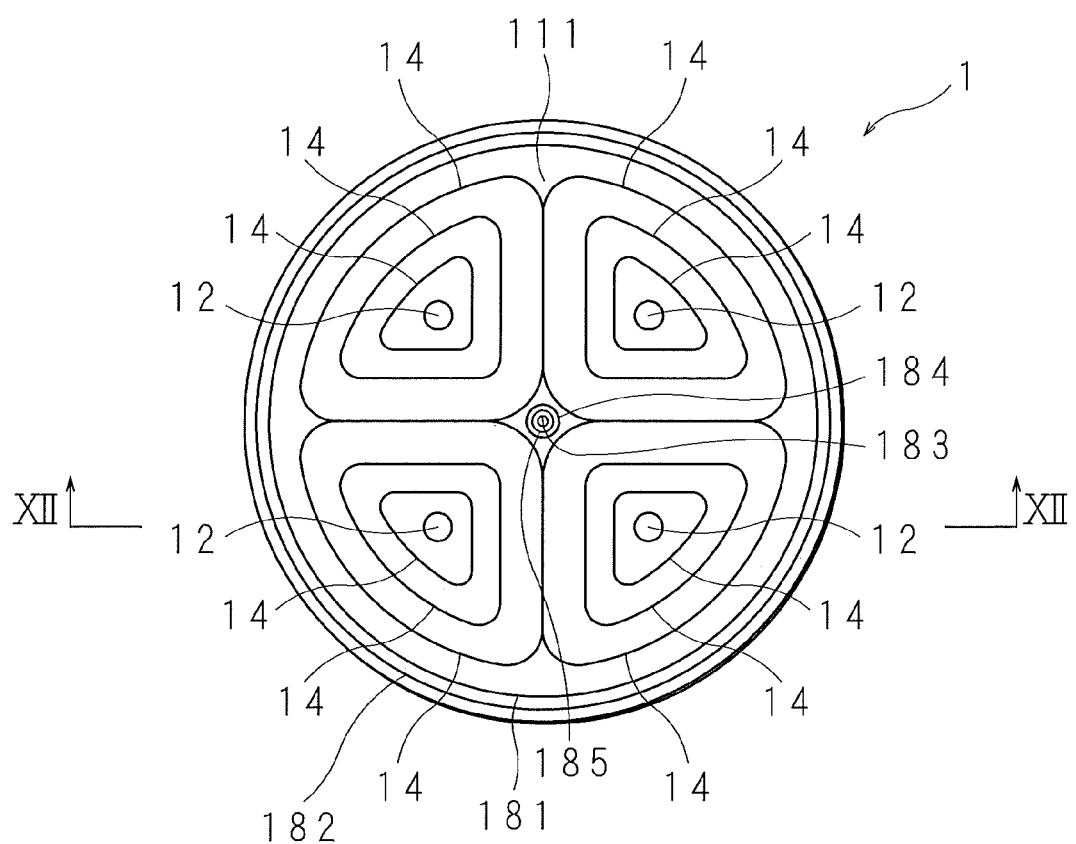
FIG. 10 is a schematic plan view of a radiation detection element according to Embodiment 2 when viewed from the first surface side.

FIG. 10 is a schematic plan view of the radiation detection element 1 according to Embodiment 2 when viewed from the first surface side 111. Multiple sets of multiple curved electrodes 14 each having a ring shape are disposed on the first surface 111 of the Si layer 11. FIG. 10 shows an example in which four sets of multiple curved electrodes 14 are disposed. Any number of sets of the multiple curved electrodes such as eight sets or the like is appropriate without being limited to four sets. The multiple sets of the multiple curved electrodes 14 are arranged evenly around the center of the first surface 111. Though FIG. 10 shows an example in which three curved electrodes 14 are included in each set, more curved electrodes 14 are disposed in practice. At the position surrounded by the multiple curved electrodes 14 of each set, a signal output electrode 12 is disposed. The outermost curved electrodes 14 included in the respective sets of the multiple curved electrodes 14 are partially shared with one another. Note that the curved electrodes 14 need not have shared regions.

At the center of the radiation detection element 1, a through-hole 183 is formed. For example, the through-hole 183 allows radiation with which a sample is irradiated to pass through and radiation generated from the irradiated sample enters the radiation detection element 1. Around the through-hole 183, an annular ground electrode 185 is disposed. At the circumference of the sets of the multiple curved electrodes 14, an annular ground electrode 182 is disposed. The ground electrodes 182 and 185 are connected to a ground potential. Between the ground electrode 185 and the curved electrodes 14, a protection part 184 for preventing an electric breakdown between the ground electrode 185 and the curved electrodes 14 is disposed. Between the multiple sets of the multiple curved electrodes 14 and the ground electrode 182, a protection part 181 for preventing an electric breakdown between the curved electrodes 14 and the ground electrode 182 is disposed.

Figure 11:
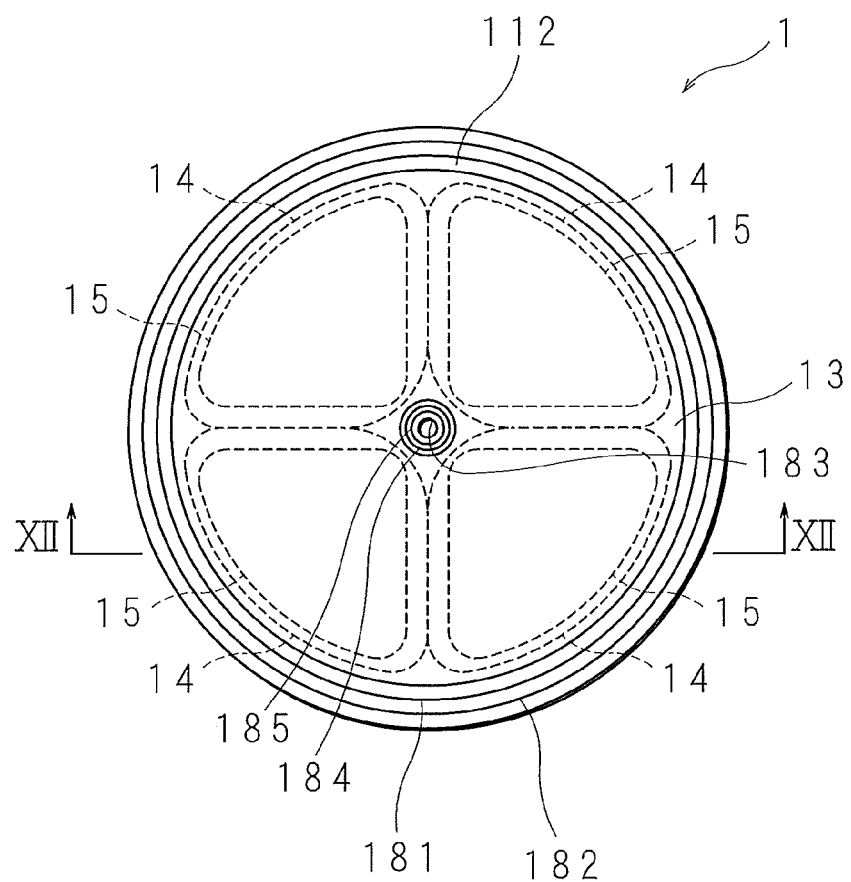
FIG. 11 is a schematic plan view of the radiation detection element according to Embodiment 2 when viewed from the second surface side.

FIG. 11 is a schematic plan view of the radiation detection element 1 according to Embodiment 2 when viewed from the second surface 112 side. The counter electrode 13 is formed on the almost entire surface of the second surface 112. In FIG. 11, the range of a heavily-doped layer 15 is represented by the dotted lines and the position on the reverse side of the outermost curved electrodes 14 is represented by the dotted lines. Between the edge of the counter electrode 13 and the edge of the second surface 112, an annular ground electrode 182 is disposed. Between the counter electrode 13 and the ground electrode 182, a protection part 181 for preventing an electric breakdown between the counter electrode 13 and the ground electrode 182 is disposed. At the circumference of the through-hole 183, the counter electrode 13 is not disposed. Between the counter electrode 13 and the through-hole 183, an annular ground electrode 185 is disposed. Between the counter electrode 13 and the ground electrode 185, a protection part 184 for preventing an electric breakdown between the counter electrode 13 and the ground electrode 185 is disposed.

The protection parts 181 and 184 are annular and conductive. The ground electrodes 182 and 185 are connected to a ground potential. The protection parts 181 and 184 are not connected to the voltage application unit 31 and the potentials of the protection parts 181 and 184 are floating potentials. It is noted that the ground electrode 182 or 185 may be disposed on only one of the first surface 111 and the second surface 112. Even on a surface not provided with the ground electrode 182 or 185, the protection part 181 or 184 may be disposed. If the ground electrode 182 is not disposed, the protection part 181 prevents an electric breakdown between the edge of the Si layer 11 and the counter electrode 13 or the curved electrodes 14. If the ground electrode 185 is not disposed, the protection part 184 prevents an electric breakdown between the inner surface of the through-hole 183 and the counter electrode 13 or the curved electrodes 14. Alternatively, the counter electrode 13 may be formed as far as the edge of the second surface 112, and the ground electrodes 182 and 185 and the protection parts 181 and 184 may not be disposed.

FIG. 12 is a schematic cross-sectional view of the radiation detection element 1 according to Embodiment 2. FIG. 12 shows a cross-sectional view of the radiation detection element 1 taken along line XII-XII in FIGS. 10 and 11. At regions located on the reverse side of the respective signal output electrodes 12, heavily-doped layers 15 are disposed. In FIG. 12, the position of the outer edge of the heavily-doped layer 15 and the position of the outer edge of the outermost curved electrodes 14 are represented by the dotted lines in plan view. Though an example in which the position of the outer edge of the curved electrodes 14 and the position of the edge of the counter electrode 13 are aligned in plan view in FIG. 12, they need not be aligned with each other. For example, the distance from the signal output electrode 12 to the outermost curved electrode 14 may be shorter than the distance from the signal output electrode 12 to the position at a reverse side of the outer edge of the heavily-doped layer 15. Alternatively, for example, the distance from the signal output electrode 12 to the outermost curved electrode 14 may be longer than the distance from the signal output electrode 12 to the position at a reverse side of the outer edge of the counter electrode 13.

Multiple sets including the signal output electrode 12, the heavily-doped layer 15 located on the reverse side of the signal output electrode 12 and the multiple curved electrodes 14 surrounding the signal output electrode 12 are disposed. The heavily-doped layers 15 respectively disposed at regions located on the reverse side of the signal output electrodes 12 are spaced from each other. In other words, the radiation detection element 1 is provided with the multiple heavily-doped layers 15. On the second surface 112, an intermediate region 17 that is located between the multiple heavily-doped layers 15 and is not provided with the heavily-doped layer 15 is present.

As in Embodiment 1, the heavily-doped layer 15 is not disposed at the marginal region 16. The heavily-doped layer 15 located on the reverse side of the signal output electrode 12 is assumed as the heavily-doped layer 15 corresponding to this signal output electrode 12. The heavily-doped layer 15 corresponding to the signal output electrode 12 is not disposed at the region of the second surface 112 located on the reverse side of a position having a distance from the signal output electrode 12 longer than the distance from the signal output electrode 12 to the outermost curved electrode 14. As in Embodiment 1, it is desirable that the distance between the outer edge of the counter electrode 13 and the outer edge of the heavily-doped layer 15 is 1 μm or more. Note that a region with which the counter electrode 13 is overlapped and with which the heavily-doped layer 15 is not provided may also be disposed other than the marginal region 16 and the intermediate region 17.

As in Embodiment 1, the counter electrode 13, the innermost curved electrodes 14 and the outermost curved electrodes 14 are connected to the voltage application unit 31. In FIG. 12, the voltage application unit 31 is not shown. The voltage application unit 31 applies voltage such that the potential of the innermost curved electrode 14 is the highest and the potential of the outermost curved electrode 14 is the lowest. Furthermore, the voltage application unit 31 applies voltage to the counter electrode 13 such that the potential of the counter electrode 13 is an intermediate potential between the innermost curved electrode 14 and the outermost curved electrode 14. Inside the Si layer 11, an electric field is generated such that the potential increases toward the signal output electrode 12. The configuration of the radiation detector 2 except for the radiation detection element 1 and the configuration of the radiation detection device 100 are similar to those of Embodiment 1.

The outermost curved electrode 14 has a maximum potential difference from the signal output electrode 12 among the multiple curved electrodes 14 surrounding the one signal output electrode 12. In other words, the outermost curved electrode 14 has the lowest potential. As illustrated in FIG. 12, on the second surface 112, the heavily-doped layer 15 corresponding to the signal output electrode 12 is not disposed at a reverse side of a position having a distance from the signal output electrode 12 longer than the distance from the signal output electrode 12 to the outer edge of the curved electrode 14 having the lowest potential.

Moreover, the heavily-doped layers 15 are not contiguous past the region located on the reverse side of the curved electrode 14 having the lowest potential. As illustrated in FIG. 12, a part of the region located on the reverse side of the curved electrode 14 having the lowest potential corresponds to the intermediate region 17, where no heavily-doped layer 15 is disposed. Though FIG. 12 shows an example in which the width of the intermediate region 17 in the cross section is smaller than that of the curved electrode 14, the width of the intermediate region 17 may be the same as or greater than that of the curved electrode 14.

As in Embodiment 1, the electric potential gradient is greater and the equipotential surfaces are denser at the heavily-doped layer 15 than the other regions of the Si layer 11. At the marginal region 16, the distance between the equipotential surfaces is narrower toward the heavily-doped layer 15 and is wider from the heavily-doped layer 15. This causes the inclined equipotential surfaces relative to the second surface 112, which generates an electric field toward the signal output electrode 12. Similarly, at the intermediate region 17 as well, the distance between the equipotential surfaces is narrower toward the heavily-doped layer 15 and is wider from the heavily-doped layer 15, which causes the inclined equipotential surfaces relative to the second surface 112. Consequently, an electric field directed to the signal output electrode 12 is also generated at the intermediate region 17 except for the positions having the same distance from the closest multiple signal output electrodes 12.

The marginal region 16 and the intermediate region 17 are located at positions far from all the signal output electrodes 12. For this reason, in the conventional radiation detection element, charges generated in the marginal region 16 and the intermediate region 17 are difficult to be collected to the signal output electrode 12. Furthermore, the marginal region 16 is located on the reverse side of a position having the distance from the signal output electrode 12 longer than the distance from the signal output electrode 12 to the outermost curved electrode 14, which makes an electric potential gradient by the curved electrodes 14 gentle. In addition, the intermediate region 17 is located on the reverse side of the curved electrode 14 having the lowest potential, which makes an electric potential gradient by the curved electrodes 14 gentle. Absence of the heavily-doped layer 15 at the marginal region 16 and the intermediate region 17 generates an electric field directed to the signal output electrode 12 at a region less affected by the electric potential gradient due to the curved electrodes 14. The electric fields occurring at the marginal region 16 and the intermediate region 17 are more directed toward the signal output electrode 12 compared with the conventional one.

The electric fields generated in the marginal region 16 and the intermediate region 17 occur in the direction more toward the signal output electrode 12 compared to the electric fields generated in the marginal region and the intermediate region of the conventional radiation detection element not provided with the heavily-doped layer 15. Thus, in the present embodiment, charges generated in the marginal region 16 and the intermediate region 17 are more likely to flow to the signal output electrode 12 as compared with the conventional radiation detection element. In other words, the radiation detection element 1 according to the present embodiment allows the charges generated at a position far from the signal output electrode 12 to more reliably collect to the signal output electrode 12 than the conventional radiation detection element. This expands the range capable of collecting charges generated by radiation to the signal output electrode 12. Accordingly, the sensitive area that allows detection of radiation in the radiation detection element 1 is expanded. In addition, since the electric field occurring in the intermediate region 17 is directed to the closest signal output electrode 12, the electric charges generated in the intermediate region 17 are likely to collect to the closest signal output electrode 12 and unlikely to dispersedly collect to the multiple signal output electrodes 12. This reduces occurrence of signals from the multiple first electrodes for a single radiation, which enables accurate count and energy of radiation.

As in Embodiment 1, in the present embodiment, charges generated at positions far from the signal output electrode 12 are reliably collected, whereby the sensitive area can be expanded without uselessly increasing the size of the radiation detection element 1. The expansion of the sensitive area improves the detection efficiency of radiation. Moreover, the simple structure for expanding the sensitive area simplifies the structure of the radiation detection element 1.

Though the counter electrode 13 is configured to be disposed over the entire second surface 112 in the present embodiment, the counter electrode 13 may be separated into multiple portions. Here, the area of each of the heavily-doped layer 15 is smaller than the area of each of the counter electrodes 13 in plan view. The voltage application unit 31 applies voltage to the counter electrodes 13. Here, electric fields are generated inside the Si layer 11, and electric fields directed to the signal output electrode 12 also occur at the marginal region 16 and the intermediate region 17. Furthermore, though the radiation detection element 1 is configured to be provided with the curved electrodes 14 in Embodiments 1 and 2, the radiation detection element 1 needs not be provided with the curved electrodes 14.

Though the multiple sets including the signal output electrode 12 and the multiple curved electrodes 14 are arranged around the through-hole 183 in the present embodiment, the arrangement of the signal output electrode 12 and the multiple curved electrodes 14 are not limited thereto. For example, the multiple sets including the signal output electrode 12 and the multiple curved electrodes 14 may be arranged linearly or in a matrix.

Though the radiation detection element 1 in which the Si layer 11 is of an n type and the curved electrode 14 is of a p type is shown in Embodiments 1 and 2 above, the radiation detection element 1 in which the Si layer 11 is of a n p type and the curved electrode 14 is of an n type may be employed. Moreover, although the radiation detection element 1 for which electrons generated by radiation concentratedly flow to the signal output electrode 12 is mainly shown in Embodiments 1 and 2, the radiation detection element 1 for which holes generated by radiation may concentratedly flow to the signal output electrode 12 may be employed. In this mode, the voltage application unit 31 applies voltage such that the potential monotonously decreases in order from the curved electrode 14 far from the signal output electrode 12 toward the curved electrode close to the signal output electrode 12 and that the potential of the counter electrode 13 is a potential between the innermost curved electrode 14 and the outermost curved electrode 14.

Though the radiation detection element 1 is shown to be provided with the curved electrode 14 having a ring shape in Embodiments 1 and 2, it may be provided with a curved electrode 14 having a partially-opened ring shape. The third electrode may have a shape formed of combined straight lines such as a polygon or the like though not limited to a curved shape. Though the radiation detection element 1 is shown to be provided with the semiconductor part formed of the Si layer 11 in Embodiments 1 and 2, it may be configured to be provided with a semiconductor part made of a semiconductor other than Si. Though the radiation detection device 100 is configured to have a function of irradiating the sample 5 with radiation in Embodiments 1 and 2, it needs not be provided with a function of irradiating the sample 5 with radiation.

It is to be understood that the embodiments disclosed here are illustrative in all respects and not restrictive. The scope of the present invention is defined by the appended claims, not by the above-mentioned meaning, and all changes that fall within the meanings and the bounds of the claims, or equivalence of such meanings and bounds are intended to be embraced by the claims.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

The invention claimed is:

1. A radiation detection element, comprising:
 a semiconductor part having a plate shape;
 a first electrode that is disposed on a first surface being one surface of the semiconductor part and that is configured to collect charges generated by incidence of radiation in the semiconductor part and to output a signal;
 a second electrode that is disposed on a second surface being the other surface of the semiconductor part and that is applied with voltage needed for collecting the charges; and
 a heavily-doped layer that is disposed at a region of the second surface excluding an edge of the semiconductor part and is doped heavier than the semiconductor part with dopants for making a type of a semiconductor equal to that of the semiconductor part, wherein the second electrode is doped with dopants for making a type of a semiconductor different from that of the semiconductor part and the constituent of the second electrode is a semiconductor being different in type from the semiconductor part, and the heavily-doped layer is on the second surface located at a position overlapped with the second electrode and is thicker than the second electrode.

2. The radiation detection element according to claim 1, wherein the heavily-doped layer is narrower than the second electrode.

3. The radiation detection element according to claim 1, wherein a plurality of sets of the first electrode and the heavily-doped layer are provided, the plurality of heavily-doped layers are spaced from each other, and the second surface includes a region located between the plurality of heavily-doped layers where the heavily-doped layer is not present.

4. The radiation detection element according to claim 1, further comprising a plurality of third electrodes that are disposed on the first surface, that surround the first electrode and that are different from each other in distance from the first electrode, wherein voltage is applied to the third electrodes such that an electric potential gradient with a potential varying toward the first electrode is generated in the semiconductor part.

5. The radiation detection element according to claim 4, wherein the heavily-doped layer corresponding to the first electrode is not present at a region on the second surface, the region being located on a reverse side of a position having a distance from the first electrode longer than a distance from the first electrode to the outermost third electrode out of the plurality of third electrodes on the first surface.

6. The radiation detection element according to claim 4, wherein the heavily-doped layer corresponding to the first electrode is not present at a region the second surface, the region being located on a reverse side of a position having a distance from the first electrode longer than a distance from the first electrode to an outer edge of the third electrode having a maximum potential difference from the first electrode out of the plurality of third electrodes on the first surface.

7. The radiation detection element according to claim 4, wherein a plurality of sets including the first electrode and the plurality of third electrodes are provided, and the heavily-doped layers are not contiguous past a region located on the reverse side of the third electrode having a maximum potential difference from the first electrode out of the plurality of third electrodes.

8. A radiation detector, comprising:

the radiation detection element according to claim 1;

a board on which the radiation detection element is placed; and a housing that accommodates the radiation detection element and the board.

9. A radiation detection device, comprising:

an irradiation unit that irradiates a sample with radiation;

a radiation detector according to claim 8 that detects radiation generated from the sample; and a processor, wherein the processor analyzes a detection result of radiation by the radiation detector.

* * * * *